United States Patent
Seo (10) Patent No.: US 8,122,306 B2
(45) Date of Patent: Feb. 21, 2012

(54) TEST CIRCUIT FOR SUPPORTING CONCURRENT TEST MODE IN A SEMICONDUCTOR MEMORY

(75) Inventor: Woo-Hyun Seo, Ichon (KR)

(73) Assignee: Hynix Semiconductor Inc. (KR)

( * ) Notice: Subject to any disclaimer, the term of this patent is extended or adjusted under 35 U.S.C. 154(b) by 685 days.

(21) Appl. No.: 12/144,522

(22) Filed: Jun. 23, 2008

(65) Prior Publication Data
US 2009/0006917 A1    Jan. 1, 2009

(30) Foreign Application Priority Data

Jun. 26, 2007 (KR) .................. 10-2007-0063067

(51) Int. Cl.
*G11C 29/00* (2006.01)
*G01R 31/00* (2006.01)

(52) U.S. Cl. ........................ 714/718; 702/117
(58) Field of Classification Search .............. 714/718; 365/200–201; 702/117
See application file for complete search history.

(56) References Cited

U.S. PATENT DOCUMENTS

| | | | | |
|---|---|---|---|---|
| 4,236,208 A | * | 11/1980 | O'Keefe et al. | ........ 714/43 |
| 5,309,446 A | * | 5/1994 | Cline et al. | ........ 714/718 |
| 5,677,885 A | * | 10/1997 | Roohparvar | ........ 365/201 |
| 5,933,434 A | * | 8/1999 | Roohparvar | ........ 714/718 |
| 2001/0002175 A1 | * | 5/2001 | Ooishi et al. | ........ 365/189.01 |
| 2002/0024062 A1 | * | 2/2002 | Nakahara et al. | ........ 257/200 |
| 2002/0097623 A1 | * | 7/2002 | Suzuki et al. | ........ 365/210 |
| 2004/0083072 A1 | * | 4/2004 | Roth et al. | ........ 702/117 |
| 2005/0114064 A1 | * | 5/2005 | Shin et al. | ........ 702/117 |
| 2006/0092728 A1 | * | 5/2006 | Lim | ........ 365/201 |
| 2009/0016130 A1 | * | 1/2009 | Menke et al. | ........ 365/201 |

OTHER PUBLICATIONS

Aitken, R.C.; , "A modular wrapper enabling high speed BIST and repair for small wide memories," Test Conference, 2004. Proceedings. ITC 2004. International , vol., no., pp. 997-1005, Oct. 26-28, 2004 doi: 10.1109/TEST.2004.1387365 URL: http://ieeexplore.ieee.org/stamp/stamp.jsp?tp=&arnumber=1387365&isnumber=30190.*

Mohd Noor, N. Q.; Saparon, A.; Yusof, Y.; , "An overview of microcode-based and FSM-based programmable memory built-in self test (MBIST) controller for coupling fault detection," Industrial Electronics & Applications, 2009. ISIEA 2009. IEEE Symposium on , vol. 1, no., pp. 469-472, Oct. 4-6, 2009 doi: 10.1109/ISIEA.2009.5356418.*

* cited by examiner

*Primary Examiner* — Cynthia Britt
(74) *Attorney, Agent, or Firm* — Baker & McKenzie LLP (57) ABSTRACT

A test circuit is capable of simultaneously performing various test modes. The test circuit includes a concurrent test mode controller for providing a plurality of decoding signals by receiving test mode input signals while test modes are being activated, and simultaneously providing the decoding signals if predetermined concurrent test mode signals are received.

5 Claims, 7 Drawing Sheets

TEST CIRCUIT FOR SUPPORTING CONCURRENT TEST MODE IN A SEMICONDUCTOR MEMORY

CROSS-REFERENCES TO RELATED APPLICATION

The present application claims priority under 35 U.S.C. 119(a) to Korean application number 10-2007-0063067, filed in the Korean Intellectual Property Office on Jun. 26, 2007, which is incorporated by reference in its entirety as if set forth in full.

BACKGROUND

1. Technical Field

The embodiments described herein relate to a test circuit, and more particularly, to a test circuit for supporting a concurrent test mode that can reduce the test time for a semiconductor memory.

2. Related Art

Presently, there are limited test capabilities for testing a semiconductor memory once it has been packaged. In this regard, a semiconductor memory package has an NC (no connection) pin, through which various test signals can be applied for various test modes. The various test modes allow various signals in the semiconductor memory to be monitored to ensure that the semiconductor memory does not contain a defect that will result in improper operation.

Figure 1:
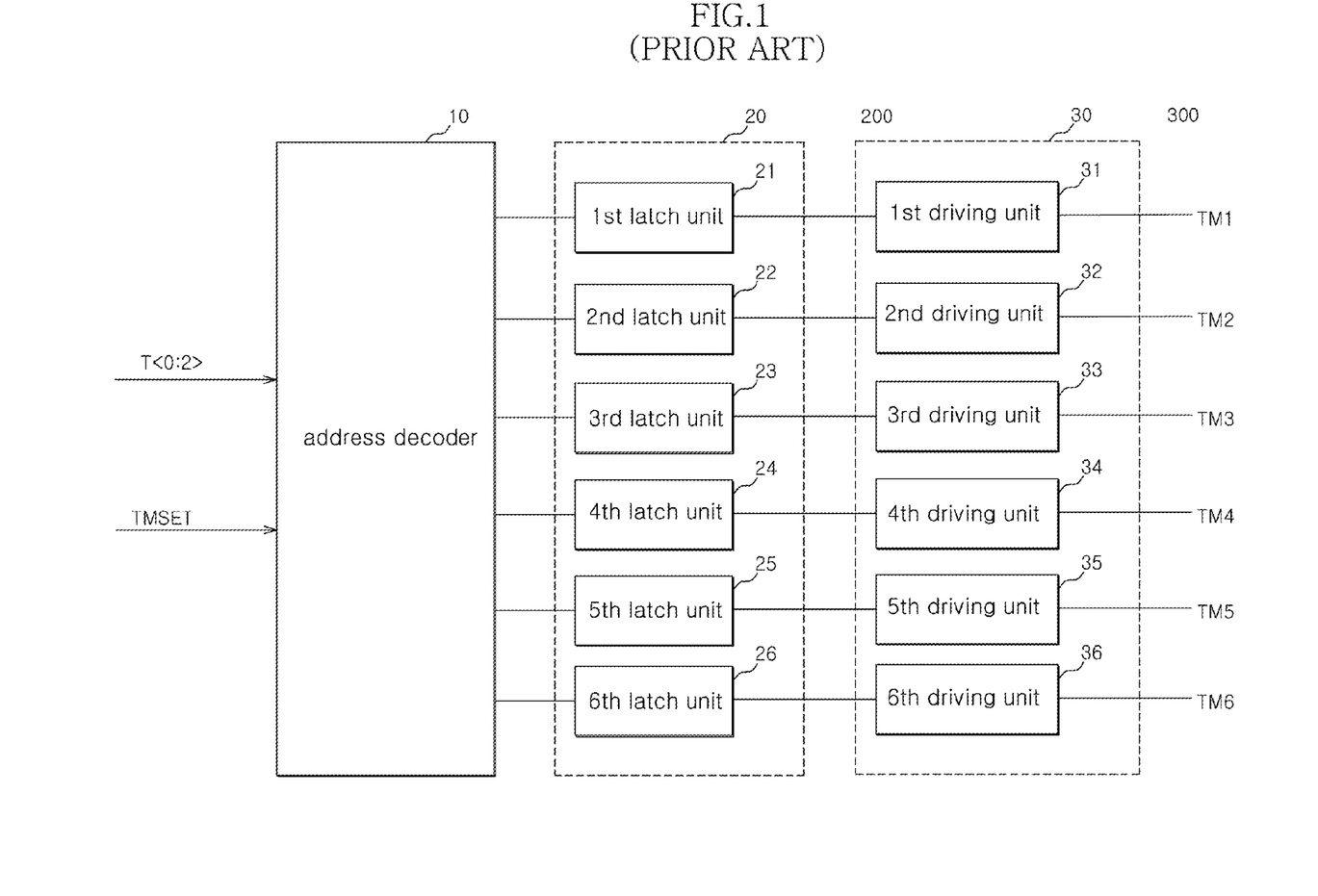
FIG. 1 is a block diagram illustrating a conventional test circuit.

FIG. 1 is a block diagram illustrating a conventional test circuit. Referring to FIG. 1, the conventional test circuit includes an address decoder 10, a latch block 20 and a driving block 30.

The address decoder 10 typically decodes test mode input signals "T<0:2>". In detail, the address decoder 10 receives and decodes the 3-bit signal test mode input signal "T<0:2>", and then provides six decoding signals based thereon. The latch block 20 then includes six latch units 21 to 26 corresponding to the six decoding signals. The driving block 30 includes six driving units 31 to 36 corresponding to the six latch units 21 to 26.

Hereinafter, an operation of the conventional test circuit of FIG. 1 will be described in detail. When defect analysis is performed, a test mode set signal "TMSET", which is used to test an operation of a semiconductor memory, is applied to the address decoder 10 through an NC pin. When the test mode set signal is activated, the semiconductor memory is switched from a normal operation mode to a test mode. The address decoder 10 then decodes the received test mode input signals "T<0:2>". The decoded signals are transmitted to one of the latch units 21 to 26 of the latch block 20 and then used to drive one of the driving units 31 to 36 of the driving block 30. Thus, the semiconductor memory performs a specific test in accordance with various test modes, such as test modes TM1 to TM6.

As described above, the conventional test circuit can implement only one test mode at a time. In other words, although various test modes exist, only one set of signals can be input, i.e., only one test mode can be implemented at any given time. In order to implement the various test modes, the test mode input signals must be continuously applied to the address decoder 10, which increases the overall test time.

SUMMARY

A test circuit capable of simultaneously performing various test modes is described herein.

According to an aspect, a test circuit includes a concurrent test mode controller configured to receive a plurality of test mode input signals, compare the received plurality of test mode signals with one or more predetermined signal patterns, provide a plurality of decoding signals based on the comparison; and a decoder coupled with the concurrent test mode controller, the decoder configured to receive the plurality of test mode input signals and to generate a plurality of test mode signals in response to the plurality of test mode input signals and the plurality of decoding signals.

According to another aspect, a test circuit includes a latch block including a plurality of latch units corresponding to the plurality of decoding signals, a driving block including a plurality of driving units corresponding to the plurality of latch units, respectively, the activated driving units providing test mode signals; and a decoding block configured to provide a plurality of decoding signals by receiving test mode input signals, the decoding block comprising a concurrent test mode controller configured to simultaneously provide the decoding signals when predetermined concurrent test mode signals are received.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to embodiments described herein, various test modes can be simultaneously performed in response to a specific test mode input signal. In detail, signals having a specific combination of the test mode input signals can be received, and the signals can then be converted through programming such that the signals can be used to perform various test modes. Thus, various test modes can be simultaneously performed in response to a plurality of test mode input signals that are simultaneously provided. To this end, the embodiments described herein include a programming unit configured to provide various test mode signals by converting the test mode input signals having the specific combination, thereby simultaneously performing various test modes.

Figure 2A:
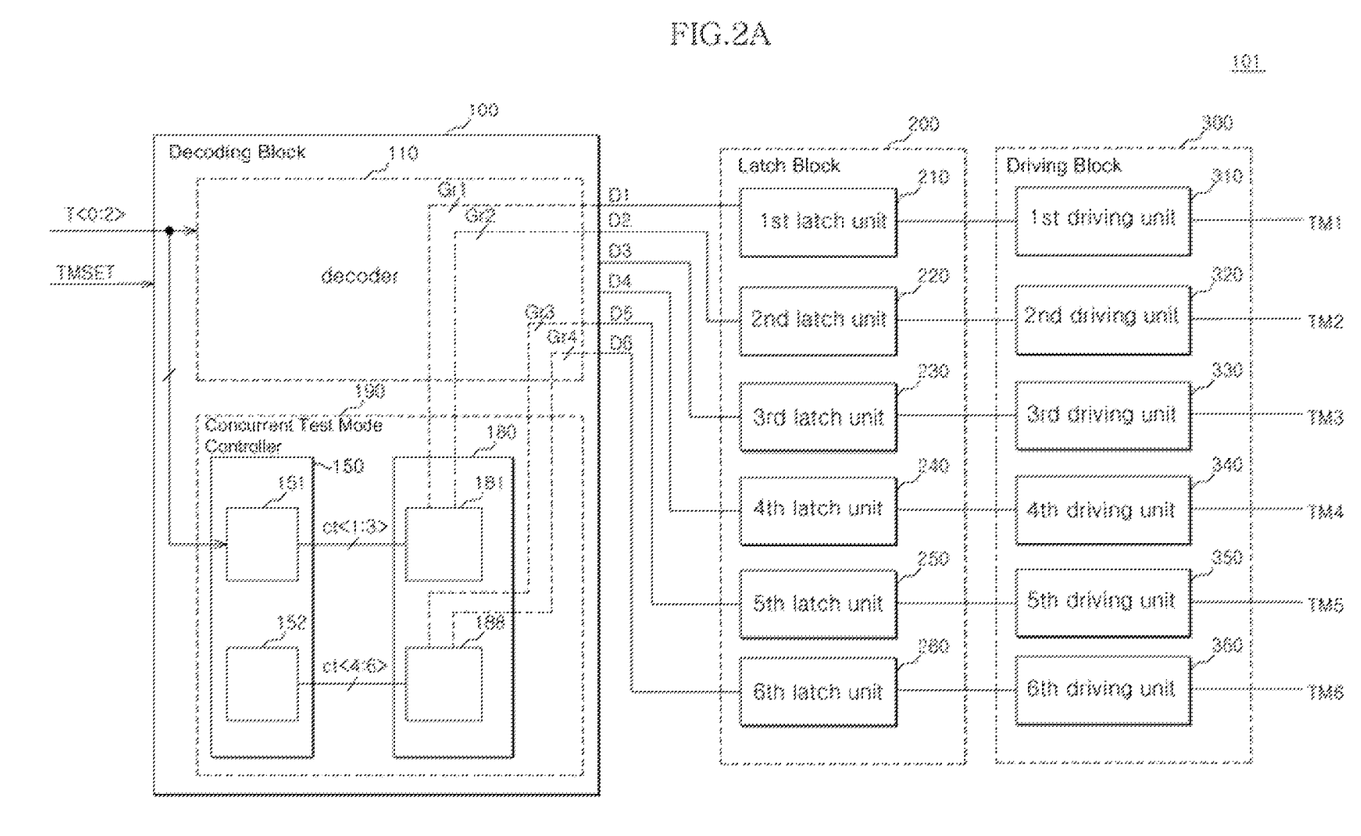
FIG. 2A is a block diagram illustrating a test circuit according to one embodiment.

A test circuit 101 according to one embodiment will be described with reference to FIGS. 2A and 2B. First, referring to FIG. 2A, the test circuit 101 can include a decoding block 100, a latch block 200 and a driving block 300.

The decoding block 100 can be configured to provide decoding signals 'D1' to 'D6' associated with various test modes by receiving a test mode set signal "TMSET" and test mode input signals 'T<0:2>'. In more detail, the decoding block 100 can receive the test mode input signals 'T<0:2>', while the test mode set signal 'TMSET' is activated.

Figure 2B:
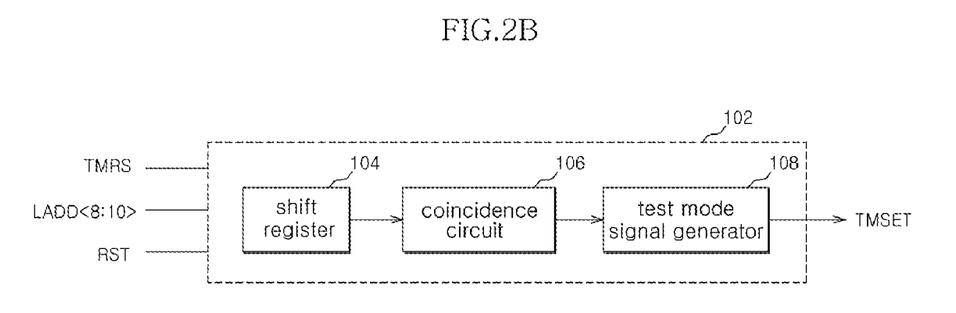
FIG. 2B is a block diagram illustrating generation of the test mode set signal in the test circuit of FIG. 2A.

FIG. 2B, is a diagram illustrating a test mode set signal generator 102 in accordance with one embodiment. As shown in FIG. 2B, such a test mode set signal 'TMSET' can be generated from a test mode MRS signal 'TMRS', test mode address signals 'LADD<8:10>' and a reset signal 'RST'.

In more detail, while the test mode MRS signal 'TMRS' is active, the test mode address signals 'LADD<8:10>' can be sequentially received through a shift register 104. A coincidence circuit 106 can be configured to determine if the received test mode address signals 'LADD<8:10>' coincide with predetermined test mode address signals. If the received test mode address signals 'LADD<8:10>' coincide with the predetermined test mode address signals, then a test mode signal generator 108 can be configured to provide the activated test mode set signal 'TMSET'. Meanwhile, in order to reset test modes, the test mode set signal 'TMSET' can be deactivated by the reset signal 'RST'.

For convenience in illustration, the test mode input signals 'T<0:2>' and the test mode entering address signals 'LADD<8:10>' are illustrated as 3-bit input signals, although this does not necessarily need to be the case.

The decoding block 100 can include a decoder 110 and a concurrent test mode controller 190. The decoder 110 can be configured to provide the decoding signals 'D1' to 'D6' by decoding the test mode input signals 'T<0:2>' when the test mode set signal 'TMSET' is active and the test mode input signals 'T<0:2>' are received.

The concurrent test mode controller 190 can include a comparison circuit 150 and a programming unit 180. Various decoding signals 'D1' to 'D6' associated with various test modes can be provided through the concurrent test mode controller 190 in response to specific combinations of the test mode input signals 'T<0:2>'.

In more detail, the comparison circuit 150 can include first and second comparison units 151 and 152 configured to determine if the received test mode input signals 'T<0:2>' coincide with predetermined combinations of test mode input signals. If the received test mode input signals 'T<0:2>' coincide with the predetermined combinations, then the comparison circuit 150 can be configured to provide first and second group control signals 'ct<1:3>' and 'ct<4:6>' based on the specific combination.

The programming unit 180 can include a first programming part 181 and a second programming part 188. The first and second programming parts 181 and 188 can simultaneously provide a plurality of decoding signals ('D1' and 'D2') and ('D5' and 'D6') associated with various test modes by coding the first and second group control signals 'ct<1:3>' and 'ct<4:6>', respectively.

The latch block 200 and the driving block 300 can include a plurality of latch units 210, 220, 230, 240, 250 and 260 and a plurality of driving units 310, 320, 330, 340, 350 and 360 corresponding to the decoding signals 'D1' to 'D6', respectively.

In detail, one decoding signal ('D<i>', i=1-6) can be input to one of the latch units 210, 220, 230, 240, 250 and 260 and one of the driving units 310, 320, 330, 340, 350 and 360, so that an associated test mode signal ('TM<j>', j=1 to 6) can be provided. Thus, a plurality of decoding signals 'D1' to 'D6' can be simultaneously provided based on the specific test mode input signals 'T<0:2>', which can result in the generation of the corresponding test mode signals 'TM1' to 'TM6'.

Figure 3:
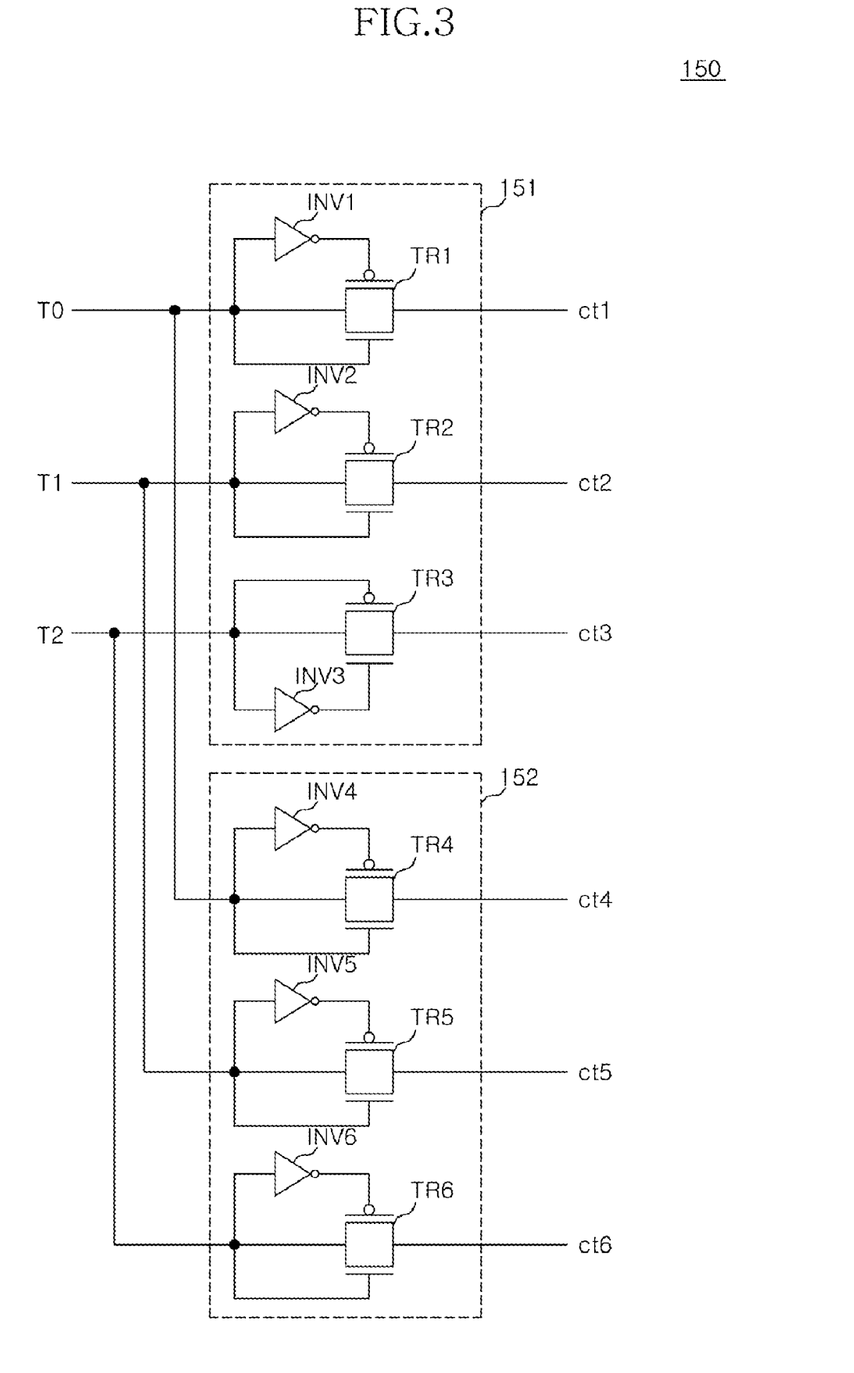
FIG. 3 is a circuit diagram illustrating a comparison circuit that can be included in the test circuit of FIG. 2A.

Referring to FIG. 3, the comparison circuit 150 can include a first comparison unit 151 and a second comparison unit 152. The first comparison unit 151 can be configured to receive the test mode input signals 'T<0:2>', and can provide first to third activated control signals 'ct1' to 'ct3' based thereon. To this end, the first comparison unit 151 can include first to third inverters INV1 to INV3, and first to third transmission gates TR1 to TR3 corresponding to the first to third inverters INV1 to INV3, respectively. The positioning of the first to third inverters INV1 to INV3 define the predetermined signal combination for the comparison purposes. For example, in the embodiment illustrated in FIG. 3, the inverters are positioned such that the pass gates TR1 to TR3 will only be activated when the test mode input signals are High-High-Low, respectively, i.e., have the signal pattern "HHL".

Similarly to the first comparison unit 151, the second comparison unit 152 can be configured to receive the test mode input signals 'T<0:2> and can provide fourth to sixth activated control signals 'ct4' to 'ct6' based thereon. To this end, the second comparison unit 152 can include fourth to sixth inverters INV4 to INV6, and fourth to sixth transmission gates TR4 to TR6 corresponding to the first to third inverters INV4 to INV6, respectively. Again, the positioning of the fourth to sixth inverters INV4 to INV6 define the predetermined signal combination for comparison in the second comparison unit. Thus, in this example, the pass gates TR4 to TR6 will only be activated when the signal pattern "HHH" is received on test mode input signals 'T<0:2>'.

Thus, when the test mode input signals 'T<0:2>' are received in the decoding block (see 100 of FIG. 1A), the concurrent test mode controller 190 of the decoding block 100 can determine if the test mode input signals 'T<0:2>' coincide with a predetermined combination of concurrent test mode signals. If the test mode input signals 'T<0:2>' coincide with the first predetermined concurrent test mode signal pattern 'HHL', then the first comparison unit 151 can be configured to provide the received test mode input signals 'T<0:2>' as the first to third control signals 'ct1' to 'ct3'. Further, if the test mode input signals 'T<0:2>' coincide with the second predetermined concurrent test mode signal pattern 'HHH', then the second comparison unit 152 can be configured to provide the received test mode input signals 'T<0:2>' as the fourth to sixth control signals ct4 to ct6.

Figure 4A:
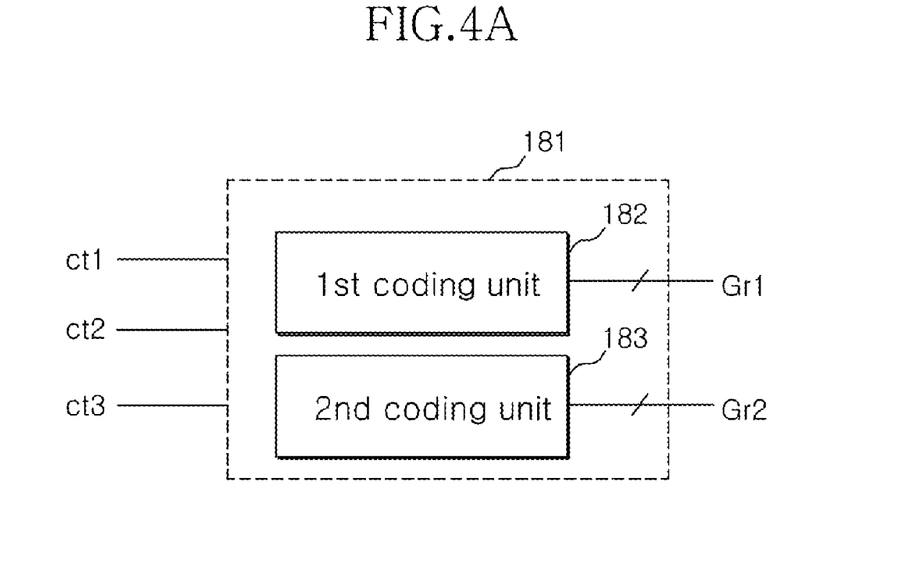
FIGS. 4A and 4B is block diagrams illustrating first and second programming units that can be included in the test circuit of FIG. 2A.
Figure 4B:
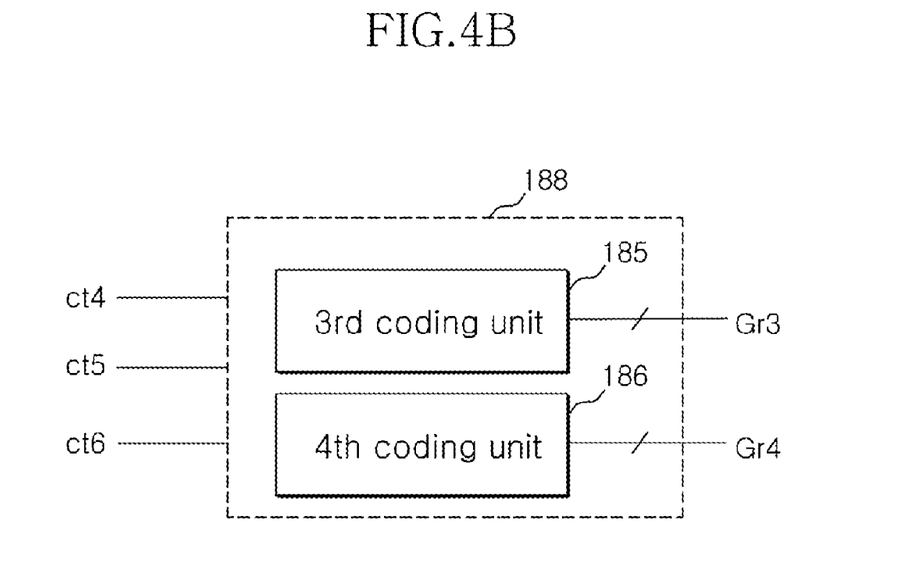

Hereinafter, a process for simultaneously providing various decoding signals based on the first to third control signals ct1 to ct3 or the fourth to sixth control signals ct4 to ct6 will be described with reference to FIGS. 4A and 4B.

First, the first programming part 181 can include a first coding unit 182 and a second coding unit 183. The first and second coding units 182 and 183 can be configured to code the first to third control signals 'ct1' to 'ct3', thereby providing a first group coding signal 'Gr1' and a second group coding signal 'Gr2'. Then, the first and second group coding signals 'Gr1' and 'Gr2' can be decoded so that the first and second decoding signals 'D1' and 'D2' can be provided.

The second programming part 188 can include a third coding unit 184 and a fourth coding unit 185. The third and fourth coding units 184 and 185 can be configured to code the fourth to sixth control signals 'ct4' to 'ct6', thereby providing a third group coding signal 'Gr3' and a fourth group coding signal 'Gr4'. Then, the third and fourth group coding signals 'Gr3' and 'Gr4' can be decoded so that the fifth and sixth decoding signals 'D5' and 'D6' can be provided.

It will be understood that more or less programming parts can be included depending on the requirements of a particular implementation.

Hereinafter, since the first programming part 181 has the same configuration and function as those of the second programming part 188, only the first programming part 181 will be described in order to avoid redundancy.

Figure 5:
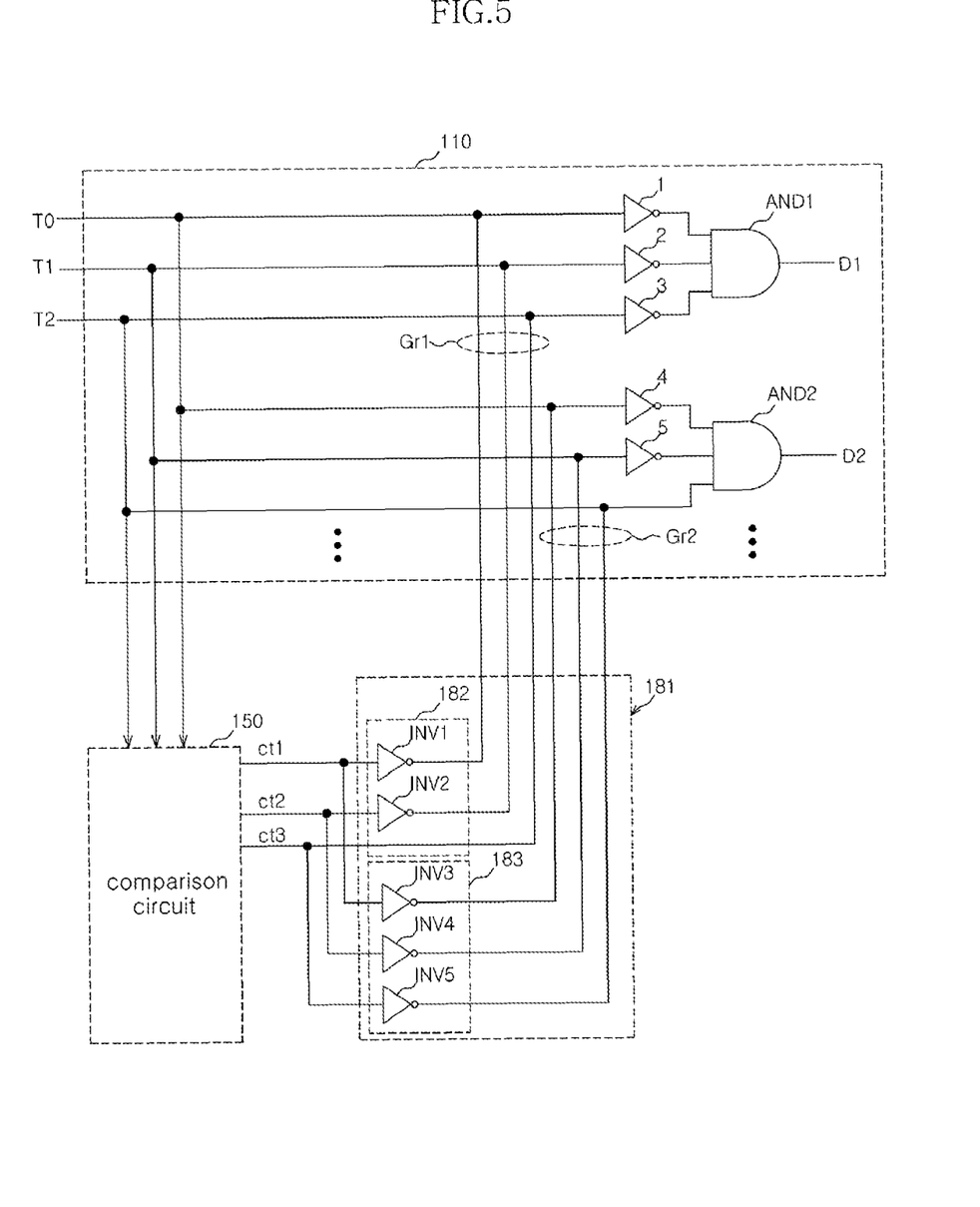
FIG. 5 is a circuit diagram illustrating a control operation of the first programming unit of FIG. 4A.

As shown in FIG. 5, the first to third control signals 'ct1' to 'ct3' can be coded such that the first and second decoding signals 'D1' and 'D2' are provided.

When the test mode input signals 'T<0:2>' are 'LLL', the first decoding signal 'D1' is activated according to the decoding scheme provided in decoder 110. When the test mode input signals 'T<0:2>' are 'LLH', the second decoding signal 'D2' is activated according to the decoding scheme within decoder 110. To this end, a plurality of inverters 1 to 5 and AND gates AND1 and AND2 are provided in the decoder 110.

In detail, the decoder 110 can include the first to third inverters 1 to 3, which can receive the test mode input signals 'T<0:2>', and the first AND gate AND1 that provides the first decoding signal 'D1' by combining output signals of the first to third inverters 1 to 3. Thus, when the test mode input signals 'T<0:2>' are "LLL", the first activated decoding signal 'D1' can be provided as a high signal.

The decoder 110 can further include the fourth and fifth inverters 4 and 5, which can receive the test mode input signals 'T<0:2>', and the second AND gate AND2 that provides the second decoding signal 'D2' by combining output signals of the fourth and fifth inverters 4 and 5. Thus, when the test mode input signals 'T<0:2>" are "LLH", the second activated decoding signal 'D2' can be provided as a high signal.

It will be understood that the embodiment of decoder 110 illustrated in FIG. 5 is by way of example only and that the actual implementation of decoder 110 will depend on the requirements of a particular implementation.

Referring to the first programming part 181, it can be seen that the first programming part 181 can comprise a first coding unit 182 that can include first and second inverters INV1 and INV2 for inverting the first and second control signals 'ct1' and 'ct2'. Further, the second coding unit 183 can include third to fifth inverters INV3 to INV5 for inverting the first to third control signals 'ct1' to 'ct3'.

When the test mode input signals 'T<0:2>' having a signal pattern of "HHL" are received, then control signals 'ct1' to 'ct3' will be activated with the same signal pattern. The first coding unit 182 will then code the first to third control signals 'ct1' to 'ct3' such that the signal pattern "LLL" is provided to the inverters 1 to 3 of the decoder 110, as first group coding signals 'Gr1'. The first activated decoding signal 'D1' can then be provided as a low level signal.

When the test mode input signals 'T<0:2>' with a signal pattern of "HHL" are received, then the second coding unit 183 can code the first to third control signals 'ct1' to 'ct3' to provide the inverters 4 and 5 of the decoder 110 with the signal pattern "LLH", as second group coding signals 'Gr2'. The second activated decoding signal 'D2' can then be provided as a high level signal.

Thus, when the test mode input signals 'T<0:2>' of "HHL" are provided, then the test mode input signals 'T<0:2>' cannot directly activate the first and second AND gates AND1 and AND2. However, in the case of the first predetermined concurrent test mode signals 'HHL', the coding operation is performed twice by using the activated control signals 'ct1' to 'ct3', so that the first and second AND gates AND1 and AND2 can be activated. This is because when the test mode input signals 'T<0:2>' having a pattern of "HHL" are received, the first group coding signals 'Gr1' will be generated having a signal pattern of "LLL" and the second group coding signal 'Gr2' will simultaneously be generated having a signal pattern of "LLH". Accordingly, the first to third inverters 1 to 3 will provide a "HHH" signal pattern to the first AND gate AND 1 and the fourth and fifth inverters 4 and 5 will cause a signal pattern of "HHH: to be provide to the second AND gate AND2.

Then, the simultaneously activated first and second decoding signals 'D1' and D2 can be provided as the first and second test mode signals 'TM1' and 'TM2' through the latch block (see 200 of FIG. 1) and the driving block (see 300 of FIG. 1).

The first test mode signal 'TM1, for example, may represent a tAC measurement test mode and the second test mode signal 'TM2', for example, may represent a DLL period measurement test mode. According to one embodiment, if the first concurrent test mode signals T<0:2> with a signal pattern of "LLL" are received, then a tAC and the period of a DLL can be simultaneously measured.

Figure 6:
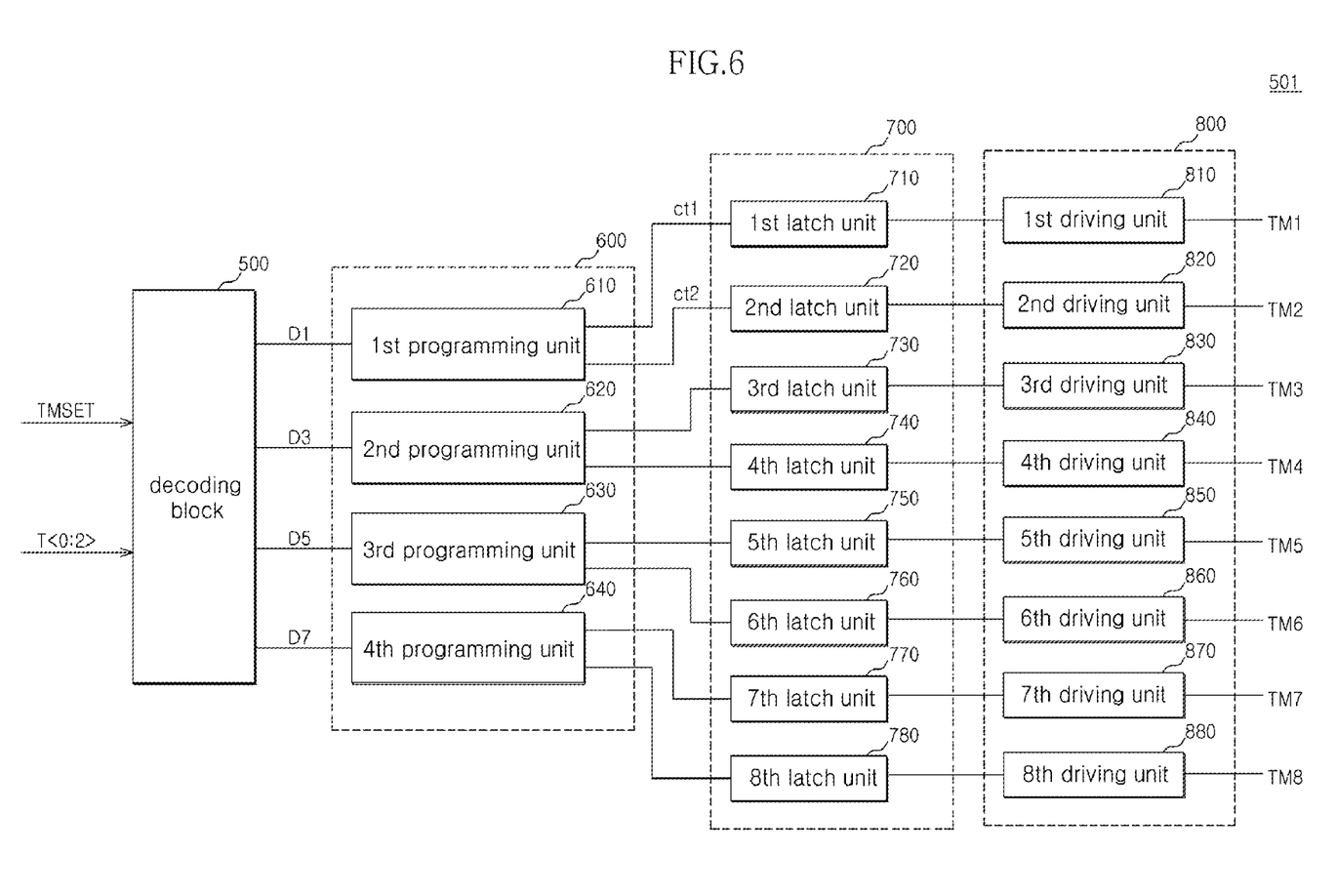
FIG. 6 is a block diagram illustrating a test circuit according to another embodiment.

FIG. 6 is a block diagram illustrating a test circuit 501 according to another embodiment. The test circuit 501 can include a decoding block 500, a programming block 600, a latch block 700 and a driving block 800.

The decoding block 500 can receives a test mode set signal 'TMSET' and test mode input signals 'T<0:2>' and then provides a plurality of decoding signals 'D1', 'D3', 'D5' and 'D7'.

The programming block 600 can include a plurality of programming units 610, 620, 630 and 640. If the decoding signals 'D1', 'D3', 'D5' and 'D7' are received, the programming units 610, 620, 630 and 640 can be configured to program the received decoding signals 'D1', 'D3', 'D5' and 'D7', respectively, thereby driving a plurality of latch units. In detail, the first programming unit 610 having received the first decoding signal 'D1' can provide two coding signals 'ct1' and 'ct2' such that first and second latch units 710 and 720 can be driven.

For example, the first programming unit 610 includes two coding units (not shown) that code one decoding signal, respectively. Thus, the decoding signal is coded twice through the two coding units so that first and second activated control signals 'ct1' and 'ct2' can be provided. Then, the first and second latch units 710 and 720 and first and second driving units 810 and 820 can be activated in response to the first and second activated control signals 'ct1' and 'ct2'. Thus, first and second activated test mode signals 'TM1' and 'TM2' can be provided. Consequently, the first and second activated test modes can be performed. The other programming units 620, 630, and 640 can operate in a similar manner.

As described above, the embodiments of the present invention use a simple coding scheme capable of activating a plurality of test modes in response to a test mode input signal for decoding, which can activate the test modes. In detail, in order to provide simultaneously activated test mode signals in response to one test mode input signal, there are provided coding units corresponding to the number of the test modes to be simultaneously tested. Thus, one test mode input signal is coded with various code values, so that the corresponding test modes can be simultaneously activated.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A test circuit comprising:
    a latch block including a plurality of latch units corresponding to a plurality of decoding signals;
    a driving block including a plurality of driving units corresponding to the plurality of latch units, respectively, the activated driving units providing test mode output signals; and
    a decoding block configured to provide the plurality of decoding signals by receiving test mode input signals, the decoding block comprising a test mode controller configured to simultaneously provide the decoding signals when predetermined concurrent test mode signals are received,
    wherein when the decoding block receives the predetermined concurrent test mode signals, the latch units and the driving units are activated in response to the activated decoding signals.

2. The test circuit of claim 1, wherein the test mode controller includes:
    a comparison circuit configured to compare whether the test mode input signals coincide with a predetermined signal pattern and to generate control signals based on the comparison; and
    a programming unit coupled with the comparison circuit, the programming unit configured to simultaneously provide the plurality of decoding signals based on the control signals.

3. The test circuit of claim 2, wherein the comparison circuit provides the test mode input signals as a plurality of control signals if the test mode input signals coincide with the predetermined concurrent test mode signals.

4. The test circuit of claim 2, wherein the programming unit includes:
    a first coding unit configured to provide a first group coding signal by coding the output signal of the comparison circuit; and
    a second coding unit configured to provide a second group coding signal by coding the output signal of the comparison circuit.

5. The test circuit of claim 4, wherein the test mode controller is further configured to provide the activated decoding signals in response to the first and second group coding signals.

* * * * *